(12) United States Patent
Bauer et al.

(10) Patent No.: US 8,681,830 B2
(45) Date of Patent: Mar. 25, 2014

(54) INTERBAND CASCADE LASER AMPLIFIER MEDIUM

(75) Inventors: Adam Bauer, Veitshoechheim (DE); Sven Hoefling, Zellingen (DE); Lukas Worschech, Wuerzburg (DE)

(73) Assignee: Julius-Maximillians-Universität-Würzburg, Würzburg (DE)

( * ) Notice: Subject to any disclaimer, the term of this patent is extended or adjusted under 35 U.S.C. 154(b) by 77 days.

(21) Appl. No.: 13/477,171

(22) Filed: May 22, 2012

(65) Prior Publication Data

US 2012/0300804 A1    Nov. 29, 2012

(30) Foreign Application Priority Data

May 25, 2011 (DE) .......................... 10 2011 103 143

(51) Int. Cl.
*H01S 5/00* (2006.01)
*H01S 3/14* (2006.01)

(52) U.S. Cl.
USPC ................ 372/45.01; 372/45.012; 372/44.01; 372/50.22

(58) Field of Classification Search
USPC ............ 372/4, 45.01, 2, 43.01, 45.012, 50.22
See application file for complete search history.

(56) References Cited

U.S. PATENT DOCUMENTS

| | | | |
|---|---|---|---|
| 5,799,026 A * | 8/1998 | Meyer et al. ................ | 372/45.01 |
| 6,566,688 B1 * | 5/2003 | Zhang et al. .................... | 257/85 |
| 6,829,269 B2 * | 12/2004 | Goodhue et al. ........... | 372/43.01 |
| 6,836,499 B2 * | 12/2004 | Capasso et al. ............ | 372/50.22 |
| 7,258,545 B2 * | 8/2007 | Hotta .............................. | 433/18 |
| 7,944,959 B2 * | 5/2011 | Maulini et al. .............. | 372/49.01 |
| 8,125,706 B2 * | 2/2012 | Vurgaftman et al. ......... | 359/344 |
| 2003/0213950 A1 | 11/2003 | Hwang | |
| 2005/0173694 A1 * | 8/2005 | Mawst et al. .................... | 257/14 |
| 2010/0097690 A1 * | 4/2010 | Vurgaftman et al. ......... | 359/344 |

OTHER PUBLICATIONS

Indjin, "Self-consistent scattering theory of transport and output characteristics of quantum cascade lasers", Jun. 2002, Journal of Applied Physics, vol. 91, No. 11.*
Indjin, "Gain-maximized GaAs/AlGaAs quantum-cascade laser with digitally graded active region", Sep. 16, 2002, Applied Physics Letters, vol. 81, No. 12.*
Menon, "Submillimeter quantum cascade laser in the GaAs/AlGaAs system", Jul. 1998, SPIE Conference on Infrared Technology and Alications XXIV. San Diego. California, SPIE vol. 3436.*
Gmachl, "High-power L=8 mm quantum cascade lasers with near optimum performance", Jun. 15, 1998, Applied Physics Letters, vol. 72, No. 24.*
German Office Action dated May 1, 2012, for Germany Application No. DE 10 2011 103 143.3, 6 pages.

* cited by examiner

*Primary Examiner* — Dameon Levi
*Assistant Examiner* — Vu Vu
(74) *Attorney, Agent, or Firm* — Mendelsohn, Drucker & Dunleavy, P.C.; Steve Mendelsohn

(57) ABSTRACT

An interband cascade laser amplifier medium having an amplifier region (V) comprising a hole quantum film (1) comprising a first semiconductor material and an electron quantum film (2) comprising a second semiconductor material, an electron collector region (K) comprising at least one collector quantum film (4) comprising a third semiconductor material and separated by a first barrier layer (3), and an electron injector region (I) following the latter and comprising at least one injector quantum film (5) comprising a fourth semiconductor material and separated by a second barrier layer (3). The first semiconductor material of the hole quantum film (1) is a III-V compound semiconductor comprising at least four elements, at least two of the elements selected from Ga, In and Al, and at least two of the elements selected from As, Sb, P and N. The amplifier medium exhibits an efficient laser emission at wavelengths above 2.5 μm.

24 Claims, 8 Drawing Sheets

INTERBAND CASCADE LASER AMPLIFIER MEDIUM

FIELD OF THE INVENTION

The invention relates to an interband cascade laser amplifier medium having an amplifier region comprising a hole quantum film composed of a first semiconductor material and an electron quantum film composed of a second semiconductor material, and also having an electron collector region and having an electron injector region following the latter, wherein the electron collector region comprises at least one collector quantum film composed of a third semiconductor material and separated by a first barrier layer, and the electron injector region comprises at least one injector quantum film composed of a fourth semiconductor material and separated by a second barrier layer.

BACKGROUND OF THE INVENTION

Such an interband cascade laser amplifier medium is known, for example, from U.S. Pat. No. 5,799,026 or from US 2010/0097690 A1. In this case, the optical transition used for the laser activity takes place between the hole quantum film and the electron quantum film. In this case, quantum film means that on account of the thickness of the corresponding semiconductor layers and as a result of the localization of the electrons in the conduction band of the electron quantum film and of the holes in the hole quantum film on account of the band profile with respect to adjacent layers, there is a quantization of the population levels perpendicular to the layer plane. Through suitable choice of the semiconductor materials, in particular the valence band edge of the hole quantum film is energetically above the conduction band edge of the electron quantum film. As a result, the emission wavelength in the case of an optical transition of an electron from the conduction band of the electron quantum film into the valence band of the hole quantum film becomes practically independent of the respective band gaps of the semiconductor materials involved. This allows, for example, semiconductor laser emissions in a wavelength range of between 3 µm and 5 µm, which, in the case of a dependence of the optical transition on the band gap of the semiconductor materials, has not been possible in an uninterrupted fashion heretofore in continuous wave operation at room temperature. Laser emissions in the so-called medium infrared range (MWIR) between 2.5 µm and 8 µm are of interest particularly for chemical analyses, for target seeking devices or for applications in the medical field.

Since the optical transition of the electron takes place between the conduction band of the electron quantum film and the valence band of the hole quantum film, that is to say between spatially adjacent semiconductor materials, a locally indirect band transition is involved. In the present case, this is referred to as a so-called type II semiconductor laser in this context. By contrast, if the optical transition takes place locally directly between the conduction band and the valence band of the same semiconductor material, then this is referred to as a type I semiconductor laser.

InAs, InAsSb, InGaAs or InAlAs are known as semiconductor materials for the electron quantum film from U.S. Pat. No. 5,799,026. GaSb, GaInSb, GaSbAs, GaSbAs and GaAlSb are disclosed as semiconductor materials for the adjacent hole quantum film in U.S. Pat. No. 5,799,026. The position of the conduction band edges and of the valence band edges of the electron and hole quantum films is configured for optimizing the optical transition through the choice of the III-V compound semiconductors and the thickness of the quantum films.

In contrast to a semiconductor diode laser, such as is described in U.S. Pat. No. 5,793,787, for example, a unipolar transport of a single charge carrier type, that is to say either of electrons or of holes, along the laser material takes place in the case of an interband cascade laser. For this purpose, an external voltage is applied to the laser material, such that charge carriers of one type migrate into the laser material on one side and leave the laser material again on the other side. Accordingly, the entire semiconductor material of a laser of this type has a uniform charge carrier doping. An n-type doping is provided for the transport of electrons as uniform majority charge carriers; a p-type doping for the transport of holes as uniform majority charge carriers.

In order to transport further an electron that has relaxed in the amplifier region as a result of optical transition into the valence band of the hole quantum film, and in order, in particular, to be able to use said electron for the purposes of a cascade multiply for further optical transitions, the amplifier region of an interband cascade laser is always adjoined by an electron collector region and subsequently an electron injector region. The electron collector region comprises at least one collector quantum film separated by means of an electron barrier layer. Likewise, the electron injector region comprises an injector quantum film separated by means of an electron barrier layer. In this case, the valence band edge of the collector quantum film, that is to say of the third semiconductor material, is energetically adapted for taking up an electron from the valence band of the second material. The conduction band edge of the injector quantum film, that is to say of the fourth semiconductor material, is energetically adapted for taking up an electron from the valence band of the third semiconductor material. According to U.S. Pat. No. 5,799,026 or US 2010/0097690 A1, a plurality of collector and injector quantum films and barrier layers can alternate both in the electron collector region and in the electron injector region. The barrier layer used between the amplifier region and the electron collector region prevents undesirable tunneling of the electron from the electronic level of the electron quantum films without the electron having relaxed radiatively into the energetically lower energy level in the hole quantum film.

In accordance with the prior art cited, the collector quantum films are configured with regard to their thickness and the choice of semiconductor material such that, for example, the highest quantized hole level corresponds energetically approximately to the highest quantized hole level in the valence band of the hole quantum film or is reduced by comparison therewith. In particular, the approximately linear profile of the electric field resulting from the applied external voltage within the semiconductor material should be taken into consideration in this case. The electron is thus allowed in particular to tunnel resonantly from the valence band of the hole quantum film into the valence band of a collector quantum film.

In order to have the electron available again for an optical transition in a further amplifier cascade, the electron collector region is adjoined by the electron injector region. The task thereof is to transfer the electron from the valence band of the collector quantum film into an electronic level in the conduction band of the injector quantum film, such that it can relax from there via the conduction band of an adjoining electron quantum film radiatively again into the valence band of a hole quantum film.

For this purpose, the conduction band of the adjoining injector quantum films is configured through the choice of the thickness and of the semiconductor material such that, by way of example, the lowest quantized level therein, taking the field profile into consideration, is energetically identical to or lower than the highest quantized hole level in the valence band of the last collector quantum film.

GaSb, GaInSb or GaSbAs, inter alia, are known as semiconductor materials for the collector quantum film from U.S. Pat. No. 5,799,026. The materials of the electron quantum film are used as materials for the injector quantum film. On account of the field profile resulting from the external voltage within the semiconductor material, which leads to band tilting, an electron when passing through the semiconductor material can thus be used multiply for the same optical transition at different locations. For this purpose, a plurality of amplifier media are connected in series by means of a corresponding layer construction. The electron collector region takes up the electron that has undergone transition and passes it on to the electron injector region. The latter injects the electrons into the next amplifier region, where they relax again as a result of optical transition.

The barrier layers enabling the electrons to tunnel by providing the potential barriers are constructed, in accordance with U.S. Pat. No. 5,799,026, in particular from semiconductor materials such as AlSb, AlInSb, AlSbAs or AlGaSb. These materials have a relatively large band gap. The levels—relevant to the optical transition—of the electrons and holes in the conduction band and in the valence band of the adjacent layers are energetically within the band gap of the barrier layers.

In the case of a diode laser, by contrast, the optical transition is situated within the depletion zone of a p-n junction. Charge transport predominantly takes place by means of electrons in the n-doped region, and by means of holes in the p-doped region. For laser operation, the radiative recombination of electrons and holes in the depletion zone is crucial, which are injected from opposite directions (contacts). In other words, bipolar charge transport by means of electrons and holes takes place. Electrons that have relaxed radiatively in the amplifier region are not transported further. Consequently, each injected electron can contribute maximally to the emission of one photon in the device.

For the electrical connection of the laser material of an interband cascade laser, specific connection and termination layers are furthermore known from the prior art. However, the exact construction of these layers is not the subject matter of the present invention.

It is disadvantageous that, for type II semiconductor lasers, as a result of the spatial separation of electrons and holes, only relatively small regions arise in which the residence probabilities thereof appreciably overlap. Increasing the spatial overlap in spatially indirect quantum films is of crucial importance, however, in order to maximize the probability of radiative transitions of injected electrons. For this purpose, firstly it is possible to reduce the thickness of the hole quantum film and of the electron quantum film, such that a larger spatial overlap of the residence probabilities arises on account of the greater localization of the charge carriers. However, a reduction of the thickness leads to a greater quantization of the energy levels, such that the transition wavelength changes. Secondly, that can be taken into account by correspondingly adapting the weight proportions in the compound semiconductors, since this influences the band gap between valence band and conduction band.

For a diode laser according to U.S. Pat. No. 5,793,787, in which the optical transition takes place in the depletion zone of a p-n junction as a result of recombination, and wherein there is no need to perform any band adaptation for transporting the relaxed charge carriers further, in order to increase the transition probability for a type II semiconductor laser it is proposed that the hole quantum film be embedded between two adjacent electron quantum films. Without further indications, a wide range of between 1.5 nm and 7.0 nm is indicated in this case for a possible thickness of the hole quantum film. Thicknesses of the hole quantum film of between 2 nm and 4 nm are disclosed as preferred. GaInSb having an indium proportion, relative to gallium, of between 0% and 60% and, in an unspecified manner, GaSb, GaInSbAs and GaInAlSb are mentioned as materials for the hole quantum film. For the electron quantum films, materials proposed include in an unspecified manner InAs, InAsSb having an antimony content, relative to indium, of less than 50%, InAsP having a phosphorus content, relative to arsenic, of less than 50%, InAlAs having an aluminum content, relative to indium, of less than 50%, InGaAs having a gallium content, relative to indium, of less than 50%, and in an unspecified manner InAlAsSb.

Owing to the absolutely necessary band adaptation for transporting the optically relaxed charge carriers further, the materials indicated for a diode laser together with their weight proportions cannot, however, be applied to the material structure of an interband cascade laser. Rather, selection of materials therefor requires further intensive research activity.

For this purpose, the later U.S. Pat. No. 5,799,026, for an interband cascade laser, takes up the concept from U.S. Pat. No. 5,793,787 for increasing the spatial overlap of the residence probabilities of an electron and of a hole, according to which a hole quantum film is embedded between two adjacent electron quantum films. In this case, owing to the wavy form of the residence probability of the electrons, this is referred to as a so-called type II quantum W laser. The amplifier region is also called a W quantum film. U.S. Pat. No. 5,799,026 proposes, for an interband cascade laser, making the hole quantum films as thin as possible for the highest possible efficiency of the radiative transition. Owing to the required band adaptation, in an unspecified manner GaSb, GaInSb, GaSb/InSb, GaSb/GaInSb, GaSbAs, GaSb/GaAs, GaAlSb and GaSb and AlSb are proposed as materials for the hole quantum film. In a non-specific manner, InAs, InAsSb, InAs/InSb, InGaAs, InAs/GaAs, InAlAs and InAs/AlAs are mentioned as materials for the electron quantum films.

A further specification of the semiconductor materials used for improving the efficiency of a type II interband cascade laser can be gathered from US 2010/0097690 A1, filed over ten years later. A $Ga_{1-x}In_xSb$ compound semiconductor is disclosed therein as an ideal material for the hole quantum film. In the manner of a W quantum film, said hole quantum film is embedded between two electron quantum films composed of InAs. By way of example, an indium proportion of 35%—relative to gallium—is indicated. The thickness of the hole quantum film is specified as 2.5 nm to 5 nm.

It is thus possible to obtain a spatial overlap of the residence probabilities of electrons and holes in the type II W quantum film of more than 60%. 2.5 μm to 8 μm at high temperatures are indicated as possible wavelengths of the radiative transition. It would be desirable, for this important wavelength range in the infrared, to further increase the spatial overlap of the residence probability of electrons and holes, in order thus to improve the efficiency further.

SUMMARY OF THE INVENTION

It is an object of certain embodiments of the invention to specify an interband cascade laser amplifier medium which exhibits the highest possible efficiency of the radiative transition in the wavelength range above 2 µm. Furthermore, it is an object of certain embodiments of the invention to specify a semiconductor laser in this spectral range which has the lowest possible energy consumption.

The first-mentioned object is achieved for an interband cascade laser amplifier medium of the abovementioned type according to the invention by virtue of the fact that the first semiconductor material of the hole quantum film is a III-V compound semiconductor composed of at least four elements, wherein at least two of the elements are selected from Ga, In and Al, and wherein at least two of the elements are selected from As, Sb, P and N.

In this case, the invention precedes in a first step from the current state of development, according to which a ternary GaInSb compound semiconductor is used as material for the hole quantum film for an interband cascade laser amplifier medium which is intended to exhibit a radiative transition above 2 µm. The spatial overlap between electrons and holes is maximized in particular in a type II W quantum film by choosing the content of indium in the GaInSb compound semiconductor to be as high as possible.

For this purpose, FIG. 1 illustrates, for such an amplifier region from the prior art, the band relations for an exemplary layer sequence of 1.7/2. 7/1.4 nm of InAs/$Ga_{0.7}In_{0.3}Sb$/InAs. This results in a W quantum film having a hole quantum film 1 embedded between two electron quantum films. The amplifier region V comprising the hole quantum film 1 and the two electron quantum films 2 is embedded between two barrier layers 3 composed of AlSb. The valence band is split into a light hole band and a heavy hole band, which is governed by the crystal. Furthermore, FIG. 1 depicts the W-shaped residence probability 10 of an electron for the energetically lowest level in the conduction band of the two electron quantum films 2 and also the residence probability 11 of a hole for the energetically highest level in the valence band of the hole quantum film 1. The emission wavelength for the optical transition is approximately 3.0 µm to 3.1 µm. Given a typical electric field of 75 kV/cm, a spatial overlap of the residence probability of electrons and hole wave function of approximately 64% results for a construction of this type.

In a second step, the invention proceeds from the consideration that natural limits are imposed on the conventional approach of further increasing the spatial overlap of the residence probabilities by increasing the indium content. This becomes clear from FIGS. 2 and 3.

In FIG. 2, the lattice constants of the resulting crystal structure are illustrated on the abscissa for various III-V semiconductors. The associated band gaps between valence band and conduction band of the semiconductors and the corresponding transition wavelength are illustrated on the two ordinates. Direct transitions in the momentum space (without phonon exchange) are illustrated in solid fashion and indirect transitions in the momentum space (with phonon exchange) are illustrated in dashed fashion. It can clearly be discerned that in a ternary compound semiconductor GaInSb an increase in the indium proportion leads to an increase in the lattice constant by comparison with GaSb, the substrate normally used. Proceeding from a lattice constant of approximately 6.1 $10^{-10}$ m in the case of GaSb, InSb has a lattice constant of almost 6.5 $10^{-10}$ m. An increase in the indium proportion in this respect leads to an increasing degree of strain relative to the substrate, which results in relaxation problems in the lattice construction and hence potentially non-radiative defect centers.

FIG. 3 supplementarily shows, for a W quantum film as illustrated by way of example in FIG. 1, given a constant emission wavelength, the spatial overlap of the residence probabilities of electrons and holes depending on the indium content in lines, plotted against the thickness of the electron quantum films composed of InAs and the hole quantum film GaInSb.

It can be gathered from FIG. 3 that the spatial overlap of the residence probabilities of the wave functions of the charge carriers initially rises continuously as the indium content increases in conjunction with the hole quantum film simultaneously becoming thinner. This is owing to the fact that the higher indium proportion reduces the band gap of the GaInSb hole quantum film, such that both the hole quantum films and the electron quantum films can be chosen to be thinner given a fixed emission wavelength. The residence probability of the electrons within the hole quantum film and hence the spatial overlap increase as a result. According to FIG. 2, however, this procedure is limited by the degree of strain increasing as the indium content increases. For indium contents above 40%, a strain of more than 2.5% relative to the substrate is present, which would lead to the non-radiative defect centers mentioned. Even if such high strains were accepted, however, the overlap values rise only moderately upon a further increase in the indium content.

In a third step, the invention recognizes, finally, that a way out of the dilemma demonstrated can be found through transition to an at least quaternary compound semiconductor as hole quantum film. In the case of an at least quaternary compound semiconductor, the band gap can be adapted by increasing the content of an element, while a resultant increasing strain as a result of a change in the lattice constant relative to the substrate can be compensated for by adding a counteracting fourth element. Thus, by way of example, arsenic, phosphorus or aluminum can be used in compensating fashion with respect to indium or antimony. An at least quaternary compound semiconductor in this respect affords the possibility of further increasing the desired spatial overlap of the residence probabilities of the wave functions of the charge carriers relative to the prior art and thus of further improving the efficiency of the radiative transition, wherein the degree of strain relative to the substrate can be kept within limits, which in turn has a positive effect on the efficiency of the laser medium.

This insight of the invention becomes clear from FIG. 4, which illustrates, for a hole quantum film composed of GaInSb having a thickness of 3 nm embedded between two electron quantum films composed of InAs in accordance with FIG. 1, for different indium contents, in each case the experimentally determined threshold current densities for commencement of the laser activity as a function of the temperature. The threshold current densities were measured in each case for a hole quantum film composed of $Ga_{0.72}In_{0.28}Sb$ (28% In), composed of $Ga_{0.68}In_{0.32}Sb$ (32% In) and composed of $Ga_{0.64}In_{0.36}Sb$ (36% In). GaSb was used as substrate. It becomes clear that upon the transition of the indium content from 28% to 32%, firstly the threshold current densities decrease as expected in accordance with FIG. 3 owing to the increased spatial overlap of the residence probabilities of electrons and holes. Upon a further increase in the indium content to 36%, however, the threshold current densities surprisingly rise again despite a spatial overlap increasing further in accordance with FIG. 3. As a result of the increasing strain as a result of a change in the lattice constant of the hole quantum film relative to the substrate GaSb, relaxation processes in the crystal structure and hence lattice defects increasingly form as potential centers of non-radiative transitions, which overcompensate for the positive effect of the theoretically further increasing spatial overlap of the residence probabilities of the electrons and holes.

Proceeding from the current state of research, the first semiconductor material of the hole quantum film is preferably an at least quaternary GaInSbAs compound semiconductor comprising, if appropriate, further admixtures µl, P and/or N. In the system—currently favored for emission wavelengths of more than 2 µm—for a W quantum film comprising electron quantum films composed of InAs, such a compound semiconductor, through the addition of arsenic, affords the possibility of reducing lattice strains in conjunction with an increased indium content. By means of further admixtures of Al, P and/or N, it is possible to perform a further adaptation with regard to the transition probabilities, the emission wavelength or the lattice constant of the crystal structure. In accordance with FIG. 2, variation is obtained with this system in the rectangle having the points InAs/GaAs/GaSb/InSb, and thus in the range of the lowest possible band gap energies.

The first semiconductor material of the hole quantum film is particularly preferably a quaternary $Ga_xIn_{1-x}Sb_yAs_{1-y}$ compound semiconductor. In this notation, the indexes x and y are normalized to the value one and correspond in this respect, multiplied by a factor of 100, to the percentage proportion of the respective element within the elements of main group III (here Ga, In) and main group V (here As, Sb) of the periodic system. Just a small amount of arsenic suffices to reduce the degree of strain, such that the indium proportion can be increased further. In addition, $Ga_xIn_{1-x}Sb_yAs_{1-y}$ has a band gap that decreases as the arsenic proportion increases. For a constant emission wavelength, the electron quantum films can be chosen to be thinner as a result, which significantly increases the spatial overlap of the residence probabilities. In the case of a tolerable constant degree of strain of, for example, 2% relative to a substrate composed of GaSb, a large band gap corridor can be swept over in particular for a hole quantum film composed of a quaternary $Ga_xIn_{1-x}Sb_yAs_{1-y}$ compound semiconductor by means of a variable arsenic proportion.

Preferably, the index y has a value of between 0.5 and 0.99, according to which the arsenic proportion is between 1% and 50%. This range has proved to be advantageous with regard to the band adaptation for a W quantum film. With further preference, the lower limit value of y is chosen as 0.6, which corresponds to an arsenic proportion of less than or equal to 40%. It has been found that, with an arsenic proportion of less than 40% relative to antimony, the lattice strain can be brought within acceptable ranges with regard to the radiative transition, wherein at the same time the band adaptation for the tunneling level for transporting the electrons further into a subsequent electron collector region is still ensured.

Advantageously, the value 0.95 is chosen for the upper limit value of the index y. An arsenic proportion with respect to antimony of 5% or more is thus used. Even an arsenic addition of just 10% makes possible, for example for a conventional typical configuration of a W quantum film comprising a hole quantum film composed of $Ga_{0.72}In_{0.28}Sb$ with tolerable strain, an increase in the indium proportion to 54% and a spatial overlap of the residence probabilities of 72.7% given external electric field strengths of 75 kV/cm, such as are present in typical laser designs.

If, taking account of a tolerable degree of strain of up to approximately 2.6% (that is to say the relative difference in the lattice constant of the compound semiconductor relative to the substrate), taking account of the addition of arsenic, the indium content is raised beyond the range possible heretofore, then the electrons, owing to the increasing reduction of the GaInSbAs conduction band edge, now have such a high residence probability at the location of the hole quantum film that the spatial overlap with the residence probability of the holes increases, the greater the width chosen for the GaInSbAs layer. Contrary to the previous trend of keeping the hole quantum film as thin as possible for an efficient radiative transition, with the use of a quaternary compound semiconductor comprising an additional element that reduces the lattice strain, surprisingly preference should rather be given to larger thicknesses of the hole quantum film. Advantageously, therefore, the thickness of the hole quantum film is 2 nm to 10 nm. Preferably, the thickness of the hole quantum film is in this case chosen to be greater than 5 nm. In particular, thicknesses of above 6 nm should be preferred. Our own investigations suggest this embodiment variant particularly in association with two electron quantum films between which a hole quantum film is embedded. Further investigations and calculations of the band structures carried out by us suggest a preferred upper limit of the thickness of the hole quantum film of 7.5 nm for an interband cascade laser amplifier medium of the type mentioned in the introduction.

Preferably, the index x has a value of greater than 0 and less than 0.7. This corresponds to an indium content of greater than or equal to 30% relative to gallium. Increasing the indium content to above 30%, in accordance with FIG. 3, increases the spatial overlap of the residence probabilities of the electrons and holes, wherein the increasing undesirable lattice strain can be reduced by a proportion of arsenic. In this case, high arsenic proportions correlate with high indium proportions. At low indium proportions, smaller amounts of arsenic are sufficient.

With further preference, the lower limit value of the index x is equal to 0.2, which corresponds to an indium proportion of less than or equal to 80%. Above 80%, an adaptation of the tunneling level of the adjacent electron collector region becomes more difficult, since the band gap between valence and conduction band is increasingly reduced by the addition of indium in the quaternary compound semiconductor.

Advantageously, the upper limit value of the index x is equal to 0.6. In other words, the indium content is greater than or equal to 40%. The simultaneous presence of arsenic thus makes it possible to further increase the hitherto producible spatial overlap of the wave functions of electrons and holes and to use this to further increase the efficiency of the optical transition. Increasing the indium content above a proportion of 40% was unable to increase the efficiency of the optical transition any further, on account of increasing relaxation effects in the lattice structure. As a result of the presence of arsenic, an increase in the indium proportion is now associated with an increase in the efficiency of the radiative transition.

With further preference, the index x is chosen to be less than 0.4. The indium proportion is thus chosen to be greater than 60%. Significant advantages with regard to the transition probability and thus with regard to the efficiency of the radiative transition such as were not able to be produced hitherto can be obtained. By way of example, the spatial overlap of the transition probabilities of the electrons and holes can be raised to above 80% in a W quantum film.

For the second semiconductor material of the electron quantum film, in principle it is possible to use compound semiconductors containing one or more elements from the group Al, Ga, In and one or more elements from the group As, Sb in any desired combination. Preference is given to using a compound semiconductor selected from the group InAs, InAsSb, InGaAs, InAlAs and GaInAsSb. Through the choice of these III-V semiconductors, it is possible to correspondingly set the conduction band and valence band edges between hole quantum film and electron quantum film for the desired transition wavelength of more than 3 µm. The use of a further element from main group III or V of the periodic system for reducing the lattice strain makes it possible, in the hole quantum film, to reduce the conduction band edge further than has been possible heretofore without a loss in laser efficiency. For a GaInSbAs hole quantum film, in particular, the use of arsenic additionally has the effect that the band gap in the hole quantum film decreases. In this respect, whilst maintaining the emission wavelength, the thickness of the electron quantum films can be reduced further whilst taking account of the quantization of the population levels, which leads to an additional increase in the spatial overlap of the residence probabilities of electrons and holes.

Preferably, therefore, the thickness of the electron quantum film is chosen to be small and between just 0.5 nm and 5 nm, in particular between 1 nm and 3 nm.

If consideration is given to the positive effects on the spatial overlap of the residence probabilities of electrons and holes in a type II amplifier region, said positive effects resulting upon the choice of an at least quaternary compound semiconductor having, if appropriate, further admixtures of elements from main group III or V of the periodic system, then a value that is greater than two, in particular greater than 2.5, can furthermore advantageously be specified for the ratio of the thickness of a hole quantum film to the thickness of an adjacent electron quantum film. In this case, the range of the ratio of greater than 2.5 is advantageous for high indium contents above 50%, in particular of more than 60%. Particularly in combination with the abovementioned specified preferred thickness ranges of the hole quantum film and of the electron quantum film, an amplifier medium for an interband cascade laser is provided, whereby an improved efficiency by comparison with the prior art is obtained at wavelengths of more than 2.5 µm.

In a further preferred configuration of the interband cascade laser amplifier medium, at least two electron quantum films are provided. Advantageously, a so-called W quantum film is formed, in particular, in which the hole quantum film is embedded between two electron quantum films. In this case, the thickness of the two electron quantum films can also vary with respect to one another within the ranges indicated here. In particular, reference is thereby made to the adjacent electron collector region.

Expediently, for the third semiconductor material of the collector quantum film, a compound semiconductor is selected from the group GaSb, GaInSb, GaSbAs, GaInAsSb, AlGaInSb, AlGaAsSb and AlGaInAsSb. In this case, the thickness of the collector quantum film is preferably chosen to be between 1 nm and 5 nm, in particular between 2 nm and 4.5 nm.

For the fourth semiconductor material of the injector quantum film, a compound semiconductor is advantageously selected from the group InAs, InAsSb, InGaAs, InAlAs, AlInAsSb, GaInAsSb. In principle, for the fourth semiconductor material of the electron quantum film, it is possible to use compound semiconductors containing one or more elements from the group Al, Ga, In and one or more elements from the group As, Sb in any desired combination.

As material for the first and the second barrier layer, a compound semiconductor is preferably chosen from the group AlSb, AlInSb, AlSbAs, AlGaSb, AlInAsSb. These compound semiconductors are distinguished by a large band gap and, in particular, by a high conduction band edge, as a result of which the confinement of the charge carriers in the adjacent quantum films is realized. Consequently, the barrier layers provide a suitable potential barrier for the fast tunneling process required for laser operation. For this purpose, the energy level of the low electron states in the conduction band of the electron quantum films lies in the range of the band gap of the barrier layer. The collector quantum films within the electron collector region make available for the radiatively relaxed electrons in the hole quantum film in particular suitable energy levels in the valence band for said tunneling process.

The thickness of the first barrier layer is advantageously between 0.5 nm and 5 nm, in particular between 2 nm and 4 nm. A thickness of between 0.5 nm and 5 nm, in particular between 1 nm and 3 nm, has proved to be advantageous for the second barrier layer.

Furthermore, an interband cascade laser comprising an interband cascade laser amplifier medium of the type described above is specified according to the invention. Preferably, in this case a plurality of interband cascade laser amplifier media are strung together, such that, when an external voltage is applied, electrons transported by the laser are utilized multiply for an optical transition. In one particular configuration, the plurality of interband cascade laser amplifier media differ in the transition energies of the radiative transitions between the electron quantum film and the hole quantum film. An interband cascade laser having wideband emission is thus provided. Through a suitable choice of the thicknesses of hole quantum film and electron quantum film and through the proportion of the elements contained in the respective compound semiconductor, it is possible to deliberately widen the emission, or it is even possible to strive for completely separate emission wavelengths. Differing interband cascade laser amplifier media make it possible to obtain tailored gain regions.

The interband cascade laser amplifier medium is embedded into further layers comprising transition layers, confinement layers and connection layers of differentiated construction. The construction of these layers or plies is known per se and not the subject matter of the present invention.

BRIEF DESCRIPTION OF THE DRAWINGS

Exemplary embodiments of the invention will be explained in greater detail with reference to a drawing, in which.

DETAILED DESCRIPTION

Figure 1:
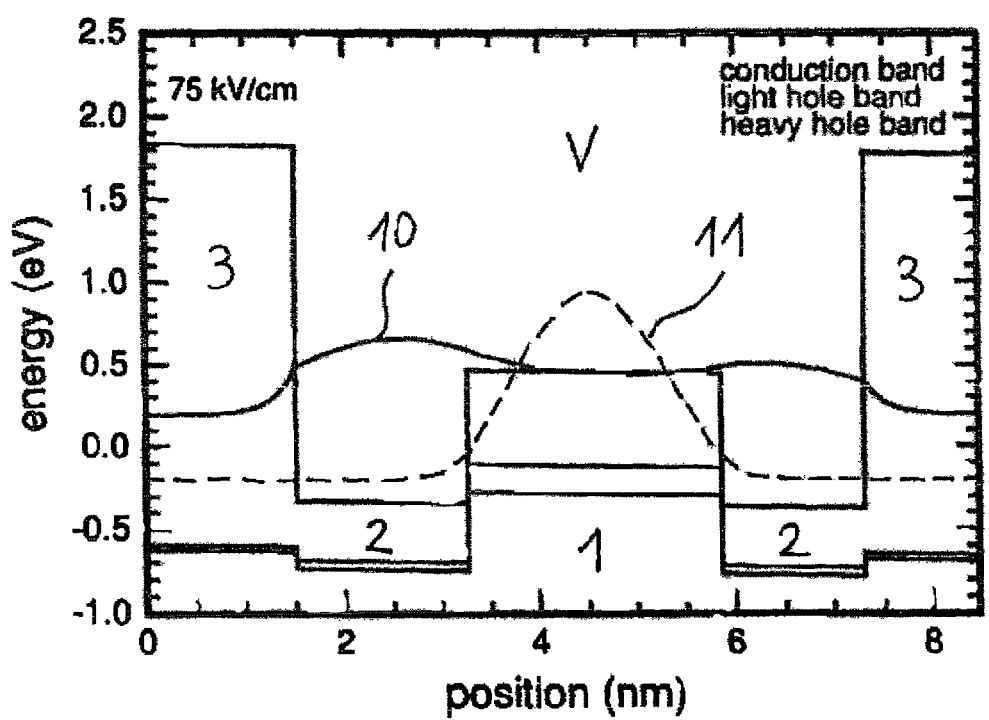
FIG. 1 shows a band diagram for a type II W quantum film laser according to the prior art.
Figure 2:
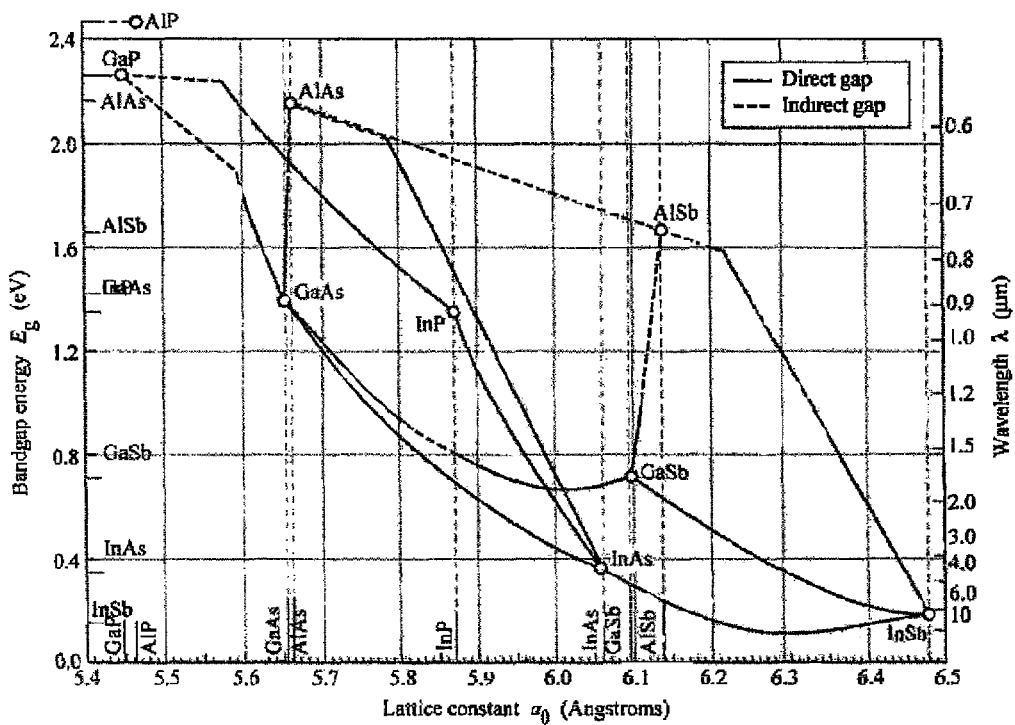
FIG. 2 shows the band gaps and lattice constants of various III-V semiconductors.
Figure 3:
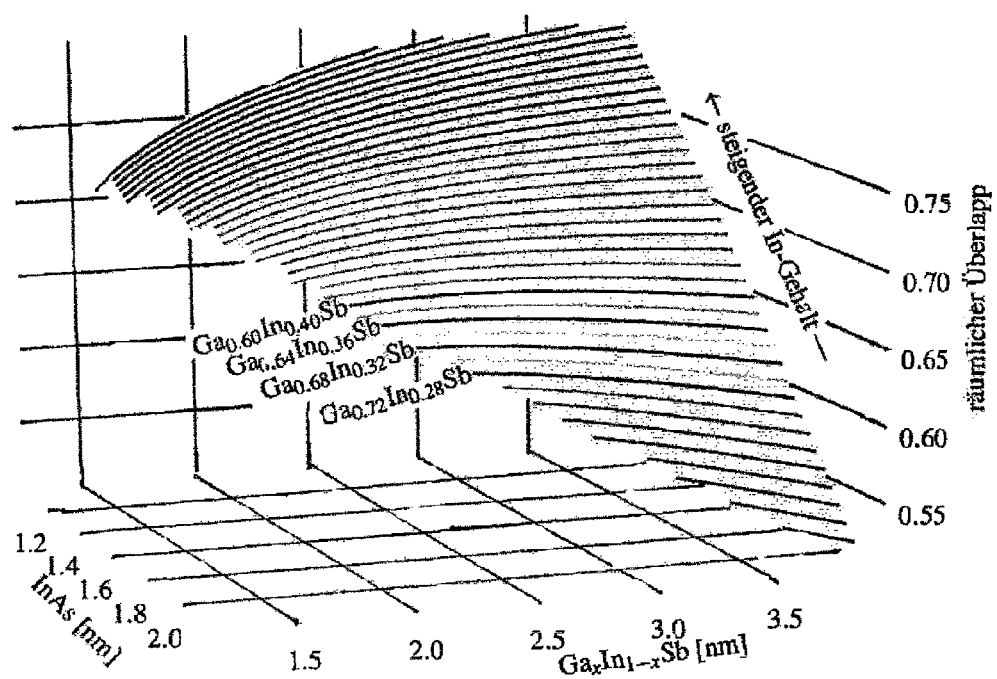
FIG. 3 shows, for a fixed emission wavelength, the spatial overlap of the residence probabilities of electrons and holes in a W quantum film comprising InAs electron quantum films and a GaInSb hole quantum film, depending on the indium proportion.
Figure 4:
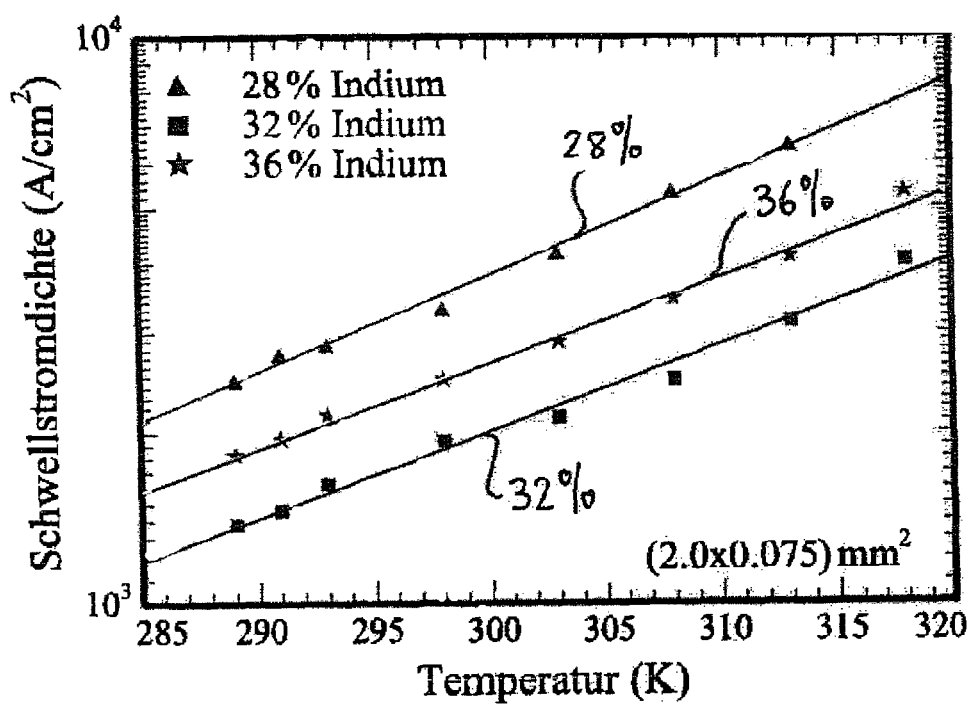
FIG. 4 shows, for various indium proportions, the profile of the temperature-dependent threshold current densities for a W quantum film comprising InAs electron quantum films and a GaInSb hole quantum film.

FIGS. 1 to 3 serve to afford a better understanding of the invention and have already been correspondingly explained in this connection in the description part. FIG. 4 has likewise already been explained and shows a significant aspect of the inventive ingenuity. Specifically, from the profile of the measured threshold current densities of an interband cascade laser amplifier medium for GaInSb hole quantum films with various indium contents, it becomes clear that the threshold current densities deteriorate despite an expected increase in the spatial overlap of the residence probabilities of the electrons and holes in the case wherein the indium proportion is increased beyond 32% in accordance with FIG. 3.

Figure 5:
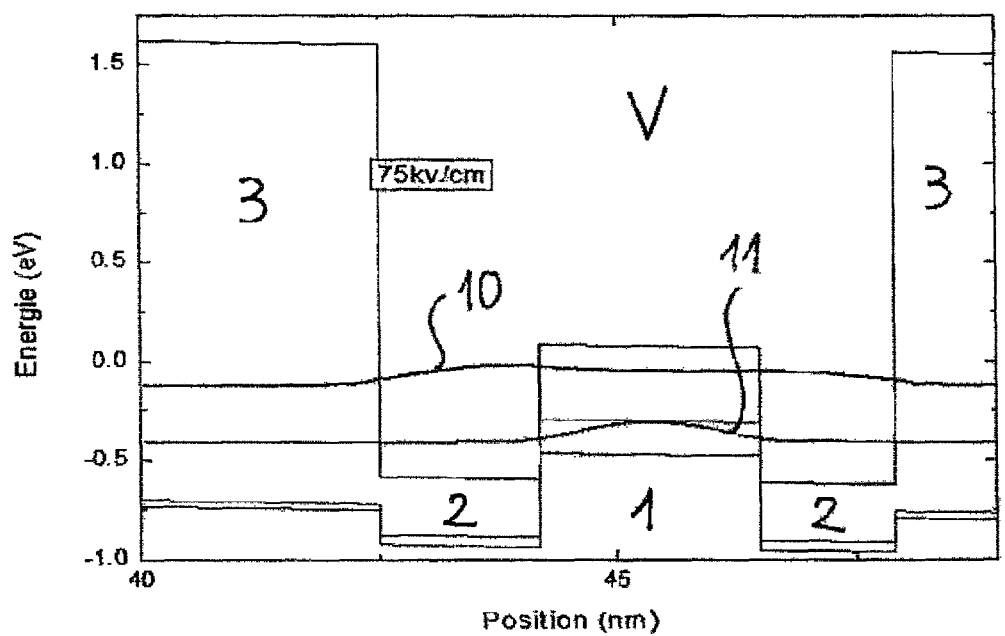
FIG. 5 shows the band structure in a type II W quantum film cascade laser, wherein a quaternary compound semiconductor is chosen for the hole quantum film.

FIG. 5 illustrates the band diagram for a W quantum film amplifier region comprising a hole quantum film 1 embedded between two electron quantum films 2. The amplifier region V comprising the hole quantum film 1 and the two electron quantum films 2 is embedded between two barrier layers 3. The valence band is split into a light hole band and a heavy hole band, which is governed on the basis of the crystal. The valence band edge of the hole quantum film 1 lies energetically above the conduction band edge of the electron quantum films 2.

The hole quantum film 1 has a thickness of 2.3 nm. A quaternary compound semiconductor of the composition $Ga_{0.46}In_{0.54}As_{0.10}Sb_{0.90}$ is used as material. The first electron quantum film 2 has a thickness of 1.70 nm. The thickness of the second electron quantum film 2 is chosen to be somewhat thinner, with a value of 1.31 nm. An InAs compound semiconductor is chosen as material for both electron quantum films 2.

The barrier layers 3 energetically confining the amplifier region V have a thickness of 1.5 nm and 1.2 nm, respectively, and comprise AlSb as semiconductor material. Accordingly, the conduction band edges are significantly higher than in the amplifier region.

Furthermore, FIG. 5 depicts the residence probability 10 of an electron for the energetically lowest level in the conduction band of the two electron quantum films 2 and also the residence probability 11 of a hole for the energetically highest level in the valence band of the hole quantum film 1. The theoretical emission wavelength for the optical transition is approximately 3.1 µm.

Since the energy gap in the hole quantum film 1 is reduced by the use of 10% arsenic, the thicknesses of the electron quantum films 2 for achieving the emission wavelength can be kept relatively small, thus additionally increasing the residence probability 10 at the location of the hole quantum film 1. The use of 54% indium reduces the conduction band edge in the hole quantum film 1, as a result of which, for the electrons at the location of the hole quantum film 1, such a high residence probability 10 arises that the overlap with the residence probability 11 of the holes increases with increasing width of the hole quantum film. In particular, the significantly flattened residence probability 10 of the electrons by comparison with the prior art in accordance with FIG. 1 becomes clear.

Overall, in accordance with FIG. 5, a spatial overlap of the residence probability 10 of the electrons with the residence probability 11 of the holes of almost 73 percent arises, which constitutes a significant improvement by comparison with the W quantum films of conventional type, wherein a GaInSb compound semiconductor is chosen as material of the hole quantum film. For W quantum films of this type, only a spatial overlap of a maximum of approximately 67% can be obtained up to a maximally tolerable indium proportion of 40%. In this case, however, such a high degree of strain is already accepted that the efficiency of the radiative transition is reduced. Even by adding just 10% arsenic and by increasing the indium proportion to 54%, a significant increase in the spatial overlap is thus obtained, which is manifested, in particular, in a higher maximum operating temperature of the laser activity.

Figure 6:
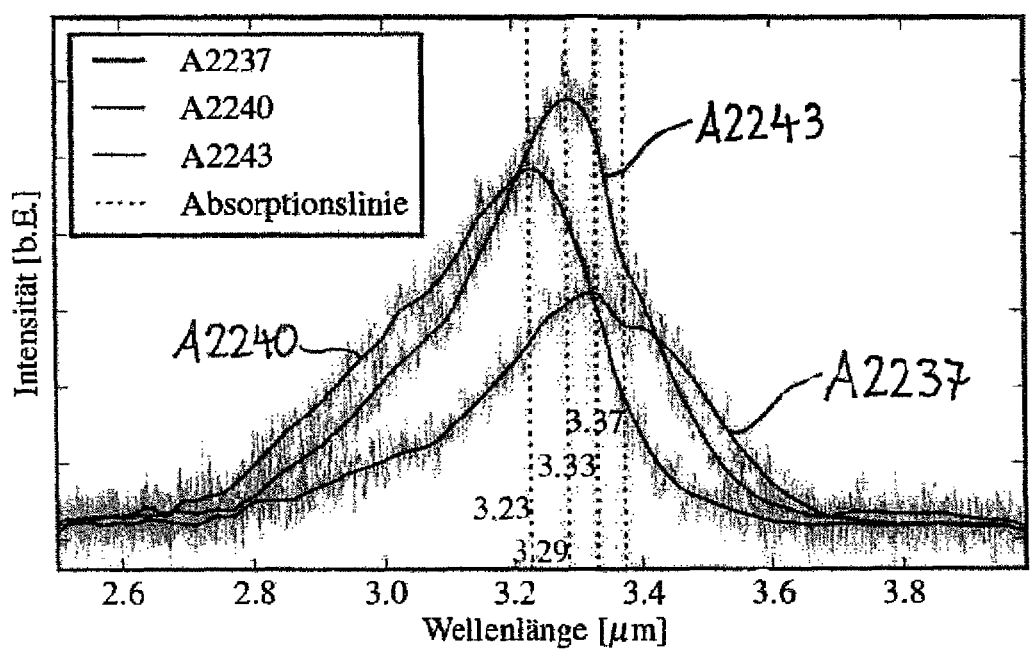
FIG. 6 shows photoluminescence measurements on W quantum films comprising InAs electron quantum films and a GaInSb hole quantum film depending on the indium content in the hole quantum film with the emission wavelength being approximately maintained.

The restriction of the efficiency of a W quantum film if a GaInSb compound semiconductor is chosen for the hole quantum film becomes clear from FIG. 6, on the basis of photoluminescence measurements. In this case, the intensities of the optical transitions were measured for three samples A2243, A2240 and A2237 having indium proportions of 32%, 36% and 40%, respectively, wherein the thicknesses of the hole quantum films and of the electron quantum films composed of InAs were in each case made as minimal as possible in order to obtain an emission wavelength of 3.3 µm. It becomes clear from FIG. 6 that as the indium content rises, the maximum intensity increases, while the aim of simultaneously keeping the emission wavelength constant is approximately achieved. The maximum intensity increases in conjunction with hole quantum films simultaneously becoming thinner, as indium proportions increase. At the same time, however, it also becomes clear that the maximum intensities increase only moderately when the indium proportion approaches 40%.

If arsenic is used, this negative trend can be ended. At the same time, contrary to the conventional expectation of those skilled in the art, the hole quantum films can then be chosen to be thicker in order to further increase the spatial overlap of the residence probabilities of electrons and holes.

Figure 7:
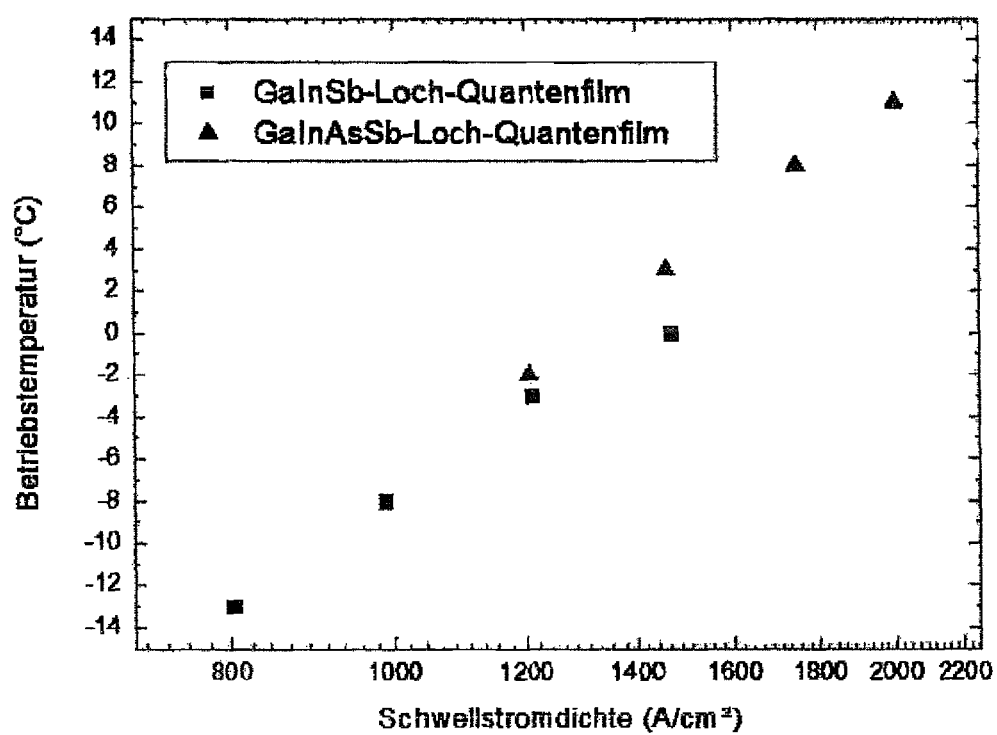
FIG. 7 shows a comparison of the threshold current densities of amplifier media comprising a W quantum film containing in one instance a GaInSb hole quantum film and in one instance a GaInAsSb hole quantum film according to FIG. 5, as a function of the temperature.

The increase in the maximum operating temperature of the laser activity during continuous-wave operation becomes clear from FIG. 7 from the comparison between the threshold current densities of two devices having identical dimensions but different W quantum film amplifier media. In this case, in one instance a $Ga_{0.72}In_{0.28}Sb$ and in one instance a $Ga_{0.46}In_{0.54}As_{0.10}Sb_{0.90}$ compound semiconductor are used as materials of the hole quantum film. By comparison with the GaInSb reference laser, the GaInAsSb laser has a spatial overlap of the residence probabilities of the electrons and holes which is increased by 6.0% according to our own calculations. It is evident in FIG. 7 that the laser activity of the reference laser can be maintained only up to 0° C., while the laser activity of a laser according to one exemplary embodiment of the invention can be maintained up to 11° C. At the same time, for the same operating temperatures, lower threshold current densities arise for the laser comprising a quaternary hole quantum film. They are, for example, 1.30 kA/cm² at a temperature of 0° C. The reference laser, by contrast, already requires 1.43 kA/cm² here. Both structures emit here in the range around 3.4 µm.

Considered in relative terms, therefore, an overlap of the residence probabilities which is increased by 6.0% in this case already leads to a threshold current density reduced by 9.1%, which, in the field of application, means lower costs for operation and for the cooling of the semiconductor laser.

Figure 8:
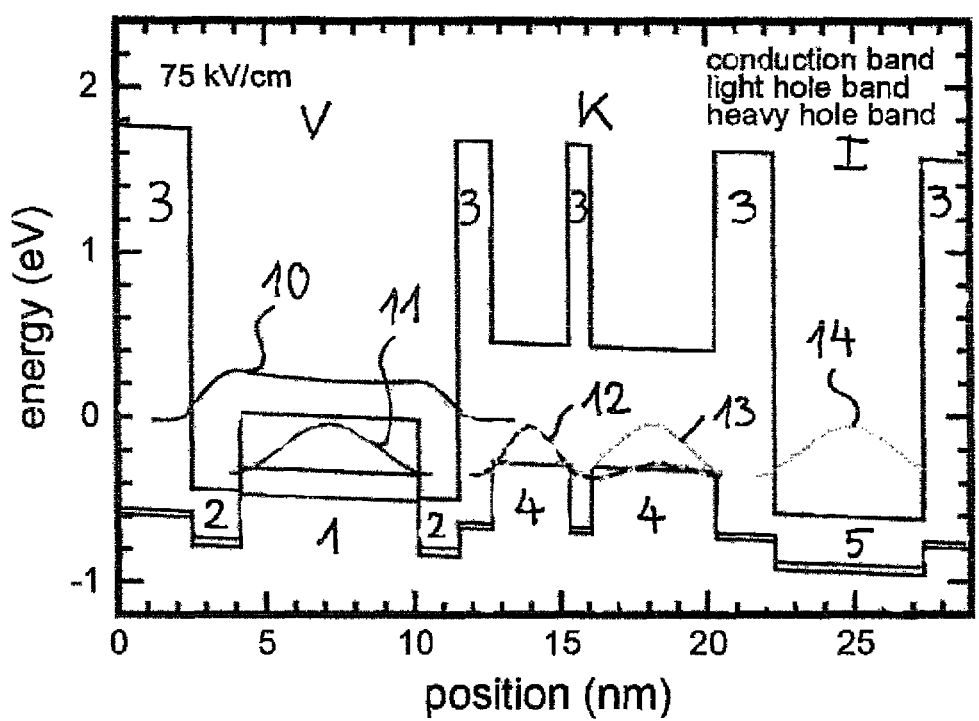
FIG. 8 shows the exemplary band diagram for an interband cascade laser amplifier medium comprising a W quantum film amplifier region comprising a hole quantum film composed of quaternary GaInAsSb, which exhibits a spatial overlap of the residence probabilities of electrons and holes of above 80%.

FIG. 8 illustrates the band structure of a layer sequence comprising an interband cascade laser amplifier medium, said sequence comprising an amplifier region V, an electron collector region K and an electron injector region I. The amplifier region V is formed from a W quantum film comprising a hole quantum film 1 embedded between two electron quantum films 2. The thickness of the hole quantum film 1 is 6 nm. The thicknesses of the electron quantum films 2 are chosen as 1.65 nm and 1.35 nm, respectively. A $Ga_{0.22}In_{0.78}Sb_{0.665}As_{0.335}$ compound semiconductor is used as material for the hole quantum film 1. The electron quantum films 2 consist of InAs. The ratio of the thickness of the hole quantum film (1) to the adjacent electron quantum films (2) is 3.64 and 4.44, respectively.

The amplifier region V is enclosed by two barrier layers 3 composed of AlSb. The latter have respective thicknesses of 2.5 and 1.2 nm.

The electron collector region K comprises two collector quantum films 4 composed of GaSb, which respectively have a thickness of 2.6 nm and 4.2 nm and are separated by a barrier layer 3 having a thickness of 0.8 nm. There follows a further barrier layer 3 having a thickness of 2.0 nm. This is adjoined by the electron injector region I, of which an injector quantum film 5 and a further barrier layer 3 are illustrated. The injector quantum film 5 is constructed from InAs. It has a thickness of 5.1 nm.

The splitting of the valence band into a light hole band and a heavy hole band also becomes clear in FIG. 8.

In the amplifier region V, the depiction shows the residence probability 10 for electrons in the energetically lowest state within the conduction band of the electron quantum films 2. The depiction likewise shows the residence probability 11 for holes in the energetically highest state within the valence band of the hole quantum film 1. For the specific case shown here, computationally a spatial overlap between the residence probability 10 of the electrons and the residence probability 11 of the holes of 82.1% arises. This constitutes a further improvement with respect to the approaches described previously, which has a further positive effect on the laser characteristic data. The amplifier region V illustrated has its theoretical emission at 3.3 μm.

Furthermore, FIG. 8 illustrates the residence probability 12 for holes in the valence band of the first collector quantum film 4 and the residence probability 13 for holes in the valence band of the second collector quantum film 4. When taking account of a field strength profile as a result of an externally applied voltage of approximately 75 kV/cm, such as is typically present, it becomes clear that resonant tunneling into the valence band of the collector quantum films 4 is possible for electrons that have relaxed into the valence band of the hole quantum film 1. The energy levels are energetically adapted.

Furthermore, the depiction shows the residence probability 14 together with the energetic position for electrons in the lowest population state of the conduction band in the injector quantum film 5. In this case, the conduction band edge in the injector quantum film 5 is adapted for taking up an electron from the valence band of the collector quantum film 4. Consequently, electrons from the valence band of the collector quantum films 4 can tunnel into the conduction band of the injector quantum film 5. Via another barrier layer 3, said electrons can tunnel into an adjoining further amplifier region V, where they are available again for an optical transition. In other words, the period of an amplifier medium as shown in FIG. 8 is continued multiply toward the right.

The layer sequences of the interband cascade laser amplifier medium described in the present case can be established in a controllable fashion by molecular beam epitaxy. For this purpose, in particular the arsenic flow rate is altered during growth. By means of specific growth sequences, it is possible to establish the desired arsenic contents in the different layers in a reproducible fashion.

Further investigations on a W quantum film of a layer sequence from the prior art composed of 2.0 nm AlSb/1.86 nm InAs/2.93 nm $Ga_{0.68}In_{0.32}Sb$/1.86 nm InAs/2.0 nm AlSb in comparison with a W quantum film of the layer sequence composed of 2.0 nm AlSb/1.86 nm InAs/2.93 nm $Ga_{0.68}In_{0.32}As_{0.10}Sb_{0.90}$/1.86 nm InAs/2.0 nm AlSb by means of photoreflection measurements show the positive effect of the addition of arsenic to the semiconductor material of the hole quantum film. With unchanged layer thicknesses, the measurement of a sample comprising the second hole quantum film by comparison with the measurement of a sample comprising the hole quantum film in accordance with the prior art shows an approximate doubling of the signal strength in the photoreflection measurements. The efficiency of the optical transition is significantly improved.

The invention claimed is:

1. An interband cascade laser amplifier medium comprising:
    an amplifier region (V) comprising:
        a hole quantum film (1) comprising a first semiconductor material; and
        an electron quantum film (2) comprising a second semiconductor material;
    an electron collector region (K) comprising at least one collector quantum film (4) comprising a third semiconductor material, the at least one collector quantum film being separated from an adjacent quantum film by a first barrier layer (3); and
    an electron injector region (I) following the electron collector region and comprising at least one injector quantum film (5) comprising a fourth semiconductor material, the at least one injector quantum film being separated from an adjacent quantum film by a second barrier layer (3), wherein:
    the first semiconductor material of the hole quantum film (1) is a III-V compound semiconductor comprising at least four elements, wherein at least two of the elements are selected from Ga, In and Al, and wherein at least two of the elements are selected from As, Sb, P and N.

2. The interband cascade laser amplifier medium as claimed in claim 1, wherein:
    the first semiconductor material of the hole quantum film (1) is a quaternary GaInSbAs compound semiconductor comprising admixtures of one or more of Al, P and N.

3. The interband cascade laser amplifier medium as claimed in claim 1, wherein:
    the first semiconductor material of the hole quantum film (1) is a quaternary $Ga_xIn_{1-x}Sb_yAs_{1-y}$ compound semiconductor.

4. The interband cascade laser amplifier medium as claimed in claim 3, wherein y is a value of between 0.5 and 0.99.

5. The interband cascade laser amplifier medium as claimed in claim 4, wherein the lower limit value of y is equal to 0.6.

6. The interband cascade laser amplifier medium as claimed in claim 4, wherein the upper limit value of y is equal to 0.95.

7. The interband cascade laser amplifier medium as claimed in claim 3, wherein x has a value of greater than 0 and less than or equal to 0.7.

8. The interband cascade laser amplifier medium as claimed in claim 7, wherein the lower limit value of x is equal to 0.2.

9. The interband cascade laser amplifier medium as claimed in claim 7, wherein the upper limit value of x is equal to 0.6.

10. The interband cascade laser amplifier medium as claimed in claim 9, wherein the value x is less than 0.4.

11. The interband cascade laser amplifier medium as claimed in claim 1, wherein the thickness of the hole quantum film (1) is 2 nm to 10 nm.

12. The interband cascade laser amplifier medium as claimed in claim 11, wherein the thickness of the hole quantum film (1) is greater than 5 nm.

13. The interband cascade laser amplifier medium as claimed in claim 11, wherein the thickness of the hole quantum film (1) is less than 7.5 nm.

14. The interband cascade laser amplifier medium as claimed in claim 1, wherein the second semiconductor material of the electron quantum film (2) is a compound semiconductor selected from the group containing InAs, InAsSb, InGaAs, InAlAs and GaInAsSb.

15. The interband cascade laser amplifier medium as claimed in claim 1, wherein the thickness of the electron quantum film (2) is between 0.5 nm and 5 nm, in particular between 1 nm and 3 nm.

16. The interband cascade laser amplifier medium as claimed in claim 1, wherein at least two electron quantum films (2) are provided.

17. The interband cascade laser amplifier medium as claimed in claim 1, wherein the third semiconductor material of the collector quantum film (4) is a compound semiconductor selected from the group containing GaSb, GaInSb, GaSbAs, GaInAsSb, AlGaInSb, AlGaAsSb and AlGaInAsSb.

18. The interband cascade laser amplifier medium as claimed in claim 1, wherein the thickness of the collector quantum film (4) is 1 nm to 5 nm.

19. The interband cascade laser amplifier medium as claimed in claim 1, wherein the fourth semiconductor material of the injector quantum film (I) is a compound semiconductor selected from the group containing InAs, InAsSb, InGaAs, InAlAs, AlInAsSb and GaInAsSb.

20. The interband cascade laser amplifier medium as claimed in claim 1, wherein, as material for the first and the second barrier layer (3), a compound semiconductor is selected from the group containing AlSb, AlInSb, AlSbAs, AlGaSb and AlInAsSb.

21. The interband cascade laser amplifier medium as claimed in claim 1, wherein the ratio of the thickness of a hole quantum film (1) to the thickness of an adjacent electron quantum film (2) is greater than 2.

22. An interband cascade laser comprising an interband cascade laser amplifier medium as claimed in claim 1.

23. The interband cascade laser as claimed in claim 22, wherein a plurality of interband cascade laser amplifier media are strung together.

24. The interband cascade laser as claimed in claim 23, wherein the plurality of interband cascade laser amplifier media differ in the transition energies of the radiative transitions between the electron quantum film (2) and the hole quantum film (1).

* * * * *